(12) United States Patent
Lamorey et al.

(10) Patent No.: US 9,018,040 B2
(45) Date of Patent: Apr. 28, 2015

(54) POWER DISTRIBUTION FOR 3D SEMICONDUCTOR PACKAGE

(71) Applicant: International Business Machines Corporation, Armonk, NY (US)

(72) Inventors: Mark C. Lamorey, South Burlington, VT (US); Janak G. Patel, South Burlington, VT (US); Peter Slota, Jr., Vestal, NY (US); David B. Stone, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/041,277

(22) Filed: Sep. 30, 2013

(65) Prior Publication Data

US 2015/0091131 A1 Apr. 2, 2015

(51) Int. Cl.
*H01L 21/00* (2006.01)
*H01L 25/00* (2006.01)
*H01L 25/18* (2006.01)
*H01L 23/00* (2006.01)

(52) U.S. Cl.
CPC ............ *H01L 25/50* (2013.01); *H01L 25/18* (2013.01); *H01L 24/17* (2013.01); *H01L 24/81* (2013.01)

(58) Field of Classification Search
USPC ........ 438/109, 106, 112, 127, 125, 26, 25, 51
See application file for complete search history.

(56) References Cited

U.S. PATENT DOCUMENTS

| 8,008,125 B2 | 8/2011 | McConnelee et al. |
| 2010/0327419 A1 | 12/2010 | Muthukumar et al. |
| 2011/0193235 A1 | 8/2011 | Hu et al. |
| 2011/0210444 A1 | 9/2011 | Jeng et al. |
| 2012/0268909 A1 | 10/2012 | Emma et al. |

FOREIGN PATENT DOCUMENTS

EP 2228824 A1 9/2010

OTHER PUBLICATIONS

Chien et al., "Chip Embedded Wafer Level Packaging Technology for Stacked RF-SiP Application", Proc. 2007 Electronic Components Technology Conference (ECTC 2007), pp. 305-310 (2007).
Lau, "TSV Interposer: The Most Cost-Effective Integrator for 3D IC Integration", Presentation 52189 at ASME InterPACK 2011, obtained from Sematech Archives at the link: http://www.sematech.org/meetings/archives/symposia/10187/Session2/04_Lau.pdf.

*Primary Examiner* — Timor Karimy
(74) *Attorney, Agent, or Firm* — Anthony J. Canale; L. Jeffrey Kelly

(57) ABSTRACT

A method including a printed circuit board electrically coupled to a bottom of a laminate substrate, the laminate substrate having an opening extending through the entire thickness of the laminate substrate, a main die electrically coupled to a top of the laminate substrate, a die stack electrically coupled to a bottom of the main die, the die stack including one or more chips stacked vertically and electrically coupled to one another, the die stack extending into the opening of the laminate substrate, and an interposer positioned between and electrically coupled to a topmost chip and the printed circuit board, the interposer providing an electrical path from the printed circuit board to the topmost chip of the die stack.

13 Claims, 9 Drawing Sheets

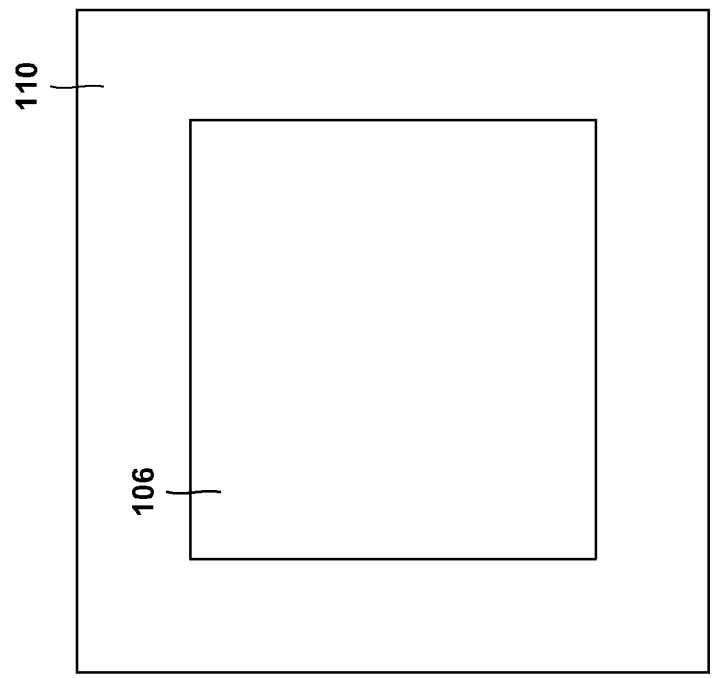
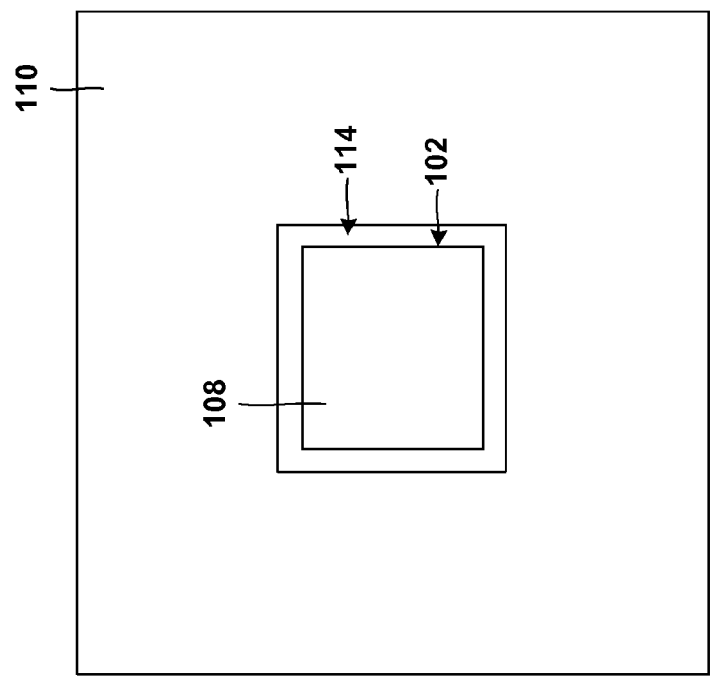
FIG. 4
TOP VIEW
FIG. 3
BOTTOM VIEW

SECTION A-A

SECTION A-A

POWER DISTRIBUTION FOR 3D SEMICONDUCTOR PACKAGE

BACKGROUND

The present invention generally relates to a 3D semiconductor package, and more particularly to power distribution throughout the 3D semiconductor package.

New integrated circuit technologies include three-dimensional integrated circuits also known as a three-dimensional semiconductor package. One type of 3D semiconductor package can include two or more layers of active electronic components stacked vertically and electrically joined with some combination of through-substrate vias and solder bumps. The 3D semiconductor package can provide numerous benefits such as increased package density yielding a smaller footprint, and improved bandwidth due to the short connection lengths made possible by the use of through-substrate vias.

One example of a 3D semiconductor package may include a main die, a die stack, a laminate substrate, and a printed circuit board (PCB). The die stack may be electrically coupled to the main die, the main die may be electrically coupled to the laminate substrate, and the laminate substrate may be electrically coupled to the PCB. In some cases the main die and the laminate substrate may be joined such that the die stack extends into a recess in the laminate substrate.

In the above example, power may be distributed from the PCB to the die stack through the laminate substrate and the main die. More specifically, power to a topmost chip, or a last chip, of the die stack must traverse numerous connections from the PCB to the laminate substrate, from the laminate substrate to the main die, and then from the main die through the multiple chips of the die stack. This configuration may result in a voltage drop and power delivery to the topmost chip of the die stack may suffer.

SUMMARY

According to one exemplary embodiment, a structure is provided. The structure may include a printed circuit board electrically coupled to a bottom of a laminate substrate, the laminate substrate having an opening extending through the entire thickness of the laminate substrate, a main die electrically coupled to a top of the laminate substrate, a die stack electrically coupled to a bottom of the main die, the die stack comprising one or more chips stacked vertically and electrically coupled to one another, the die stack extending into the opening of the laminate substrate, and an interposer positioned between and electrically coupled to a topmost chip and the printed circuit board, the interposer providing an electrical path from the printed circuit board to the topmost chip of the die stack.

According to another exemplary embodiment, a method is provided. The method may include electrically coupling a die stack to a main die, electrically coupling the main die to a laminate substrate such that the die stack extends into an opening in the laminate substrate, the opening extending through an entire thickness of the laminate substrate, and electrically coupling an interposer to a topmost chip of the die stack, the interposer is within the opening such that a bottom surface of the interposer is substantially flush with a bottom surface of the laminate substrate.

According to another exemplary embodiment, a method is provided. The method may include electrically coupling a die stack to a main die, electrically coupling the main die to a laminate substrate such that the die stack extends into an opening in the laminate substrate, the opening extending through an entire thickness of the laminate substrate, and attaching a lid to a top of the laminate substrate and a bottom of the main die. The method may further include, electrically coupling an interposer to a topmost chip of the die stack, the interposer is within the opening such that a bottom surface of the interposer is substantially flush with a bottom surface of the laminate substrate, and electrically coupling a printed circuit board to the bottom of the laminate substrate and the bottom of the interposer such that the interposer forms an electrical path from the printed circuit board directly to the topmost chip of the die stack.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings.

FIG. 3 illustrates a bottom view of FIG. 2 according to an exemplary embodiment.

FIG. 4 illustrates a top view of FIG. 2 according to an exemplary embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The present invention generally relates to a 3D semiconductor package, and more particularly to power distribution throughout the 3D semiconductor package. The ability to improve the power distribution of a 3D semiconductor package would improve performance, bandwidth, and functionality. One way to improve the power distribution of a 3D semiconductor package may include supplying power directly from a printed circuit board to a die stack. One embodiment by which to fabricate the 3D semiconductor package having the improved power distribution is described in detail below by referring to the accompanying drawings FIGS. 1-11.

Figure 1:
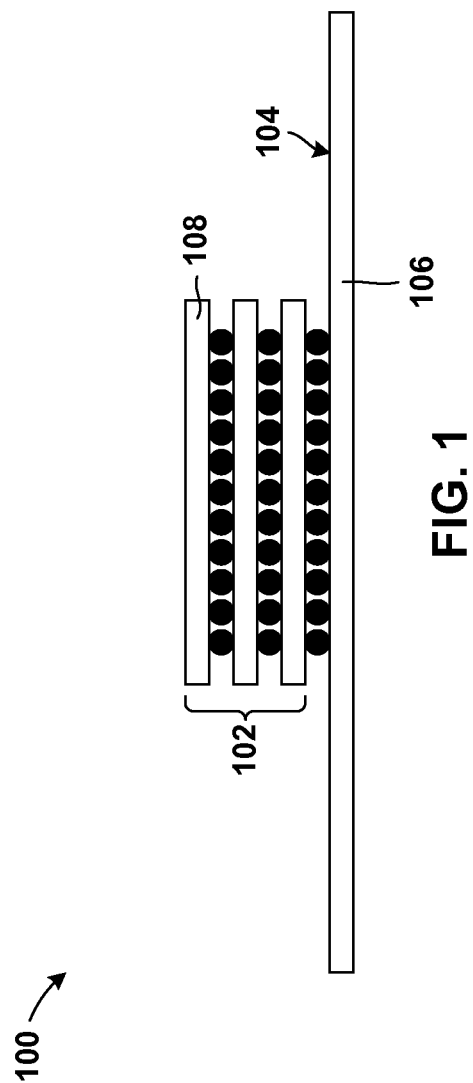
FIG. 1 illustrates forming a die stack on top of a main die according to an exemplary embodiment.

Now referring to FIG. 1, an intermediate step in the assembly of a 3D semiconductor package 100 (hereinafter "package"), is shown according to one embodiment. In this step, a die stack 102 may be electrically coupled to a top 104 of a main die 106. Preferably, the die stack 102 is electrically coupled to the connection side of the main die 106, or the side of the main die 106 from which a plurality of solder connections may be subsequently formed.

The die stack 102 may include one or more chips 108, for example, a DRAM memory chip. The chips 108 of the die stack 102 may each include a plurality of through-substrate vias to facilitate the stack configuration. Examples of the main die 106 may include a logic die or a processor die. The main die 106 is generally larger than the chips 108, and the die stack 102 may generally be positioned in a center of the main die 106. In one embodiment, the chips 108 may be stacked prior to attaching the die stack 102 to the main die 106. In another embodiment, the chips 108 may be stacked one after another directly on the main die 106. The chips 108 may be electrically coupled to each other and the main die 106 using any suitable solder connection, for example a control collapse chip connection, as illustrated in the figures. In such cases, solder may first be applied to one of the two coupled surfaces before they are joined. The order of which solder is applied and the above components are joined is not relevant to the present embodiment.

Figure 2:
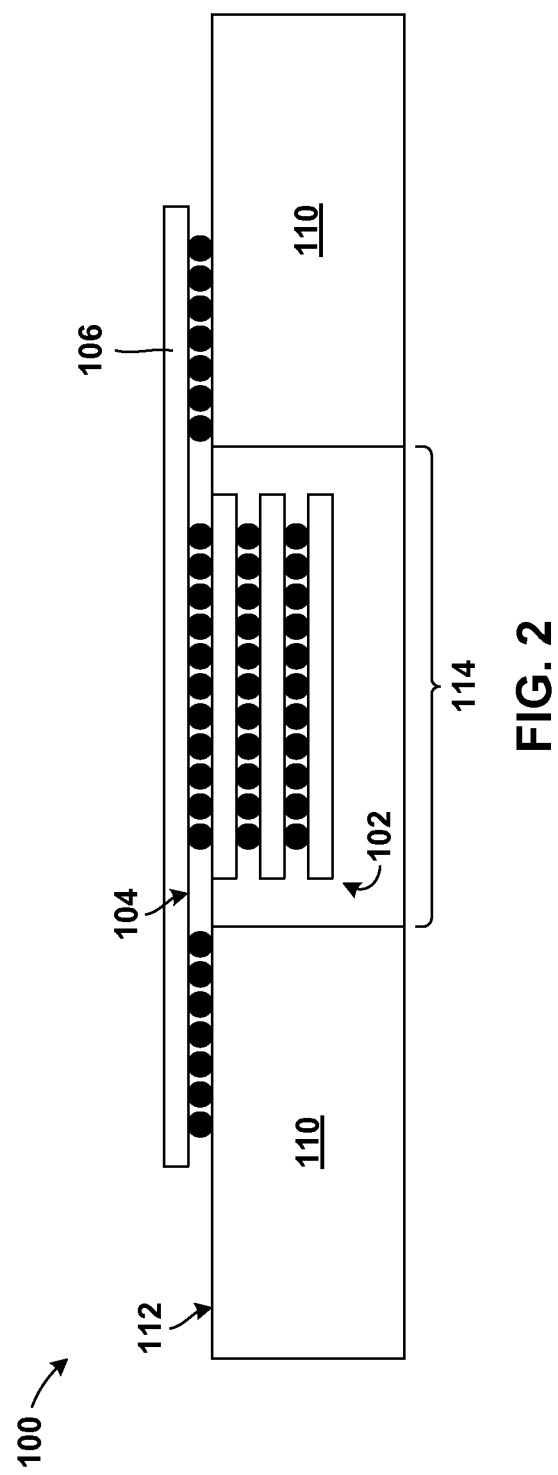
FIG. 2 illustrates attaching the main die with the die stack to a laminate substrate according to an exemplary embodiment.

Referring now to FIGS. 2, 3 and 4, the main die 106, including the die stack 102, may be electrically coupled a laminate substrate 110, such that a top 112 of the laminate substrate 110 is joined to the top 104 of the main die 106. Like above, any known solder connection, such as, for example a controlled collapse chip connection, may be used to electrically couple the main die 106 to the laminate substrate 110. When the main die 106 is joined to the laminate substrate 110 the die stack 102 may protrude into an opening 114 of the laminate substrate 110. Preferably, the die stack 102 should not extend through the opening 114, but should remain recessed within the opening 114, as shown. Stated differently, the die stack 102 should generally have a height less than the thickness of the laminate substrate 110. With continued reference to FIGS. 3 and 4, bottom view and a top view of FIG. 2 is shown, respectively.

In an alternative embodiment, the main die 106 may be electrically coupled to the laminate substrate 110 before stacking any chips (108) onto the main die 106. In such cases, the one or more chips 108 may then be attached or stacked directly on the main die 106 through the opening 114.

Figure 5:
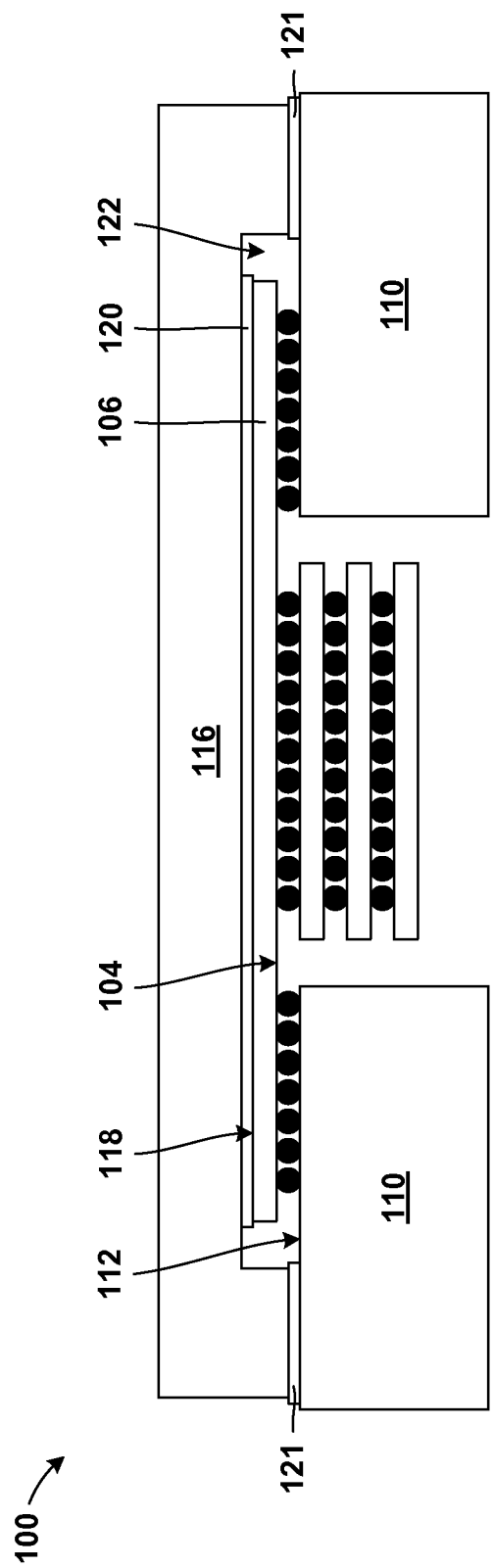
FIG. 5 illustrates attaching a lid to the laminate substrate and the main die according to an exemplary embodiment.

Referring now to FIG. 5, a lid 116 may be secured to both the top 112 of the laminate substrate 110 and a bottom 118 of the main die 106. The lid 116 may be secured to the top 112 of the laminate substrate 110 using an epoxy 120 and to the bottom 118 of the main die 106 with an adhesive 121. The epoxy 120 may include any known epoxy suitable to provide mechanical stiffness and resist warpage of the laminate substrate 110, such as, for example, sylgard 577 or EA6700. The adhesive 121 may include any known suitable adhesive, such as, for example a thermal interface material.

The lid 116 may include a recess 122 which may be generally located at or near, the center to accommodate the height of the main die 106 above the top 112 of the laminate substrate 110. In one embodiment, the lid 116 may be any material that provided mechanical stiffness and physical protection to the underlying components, such as, for example, nickel plated copper, anodized aluminum, a ceramic, or any other suitable material.

Figure 6:
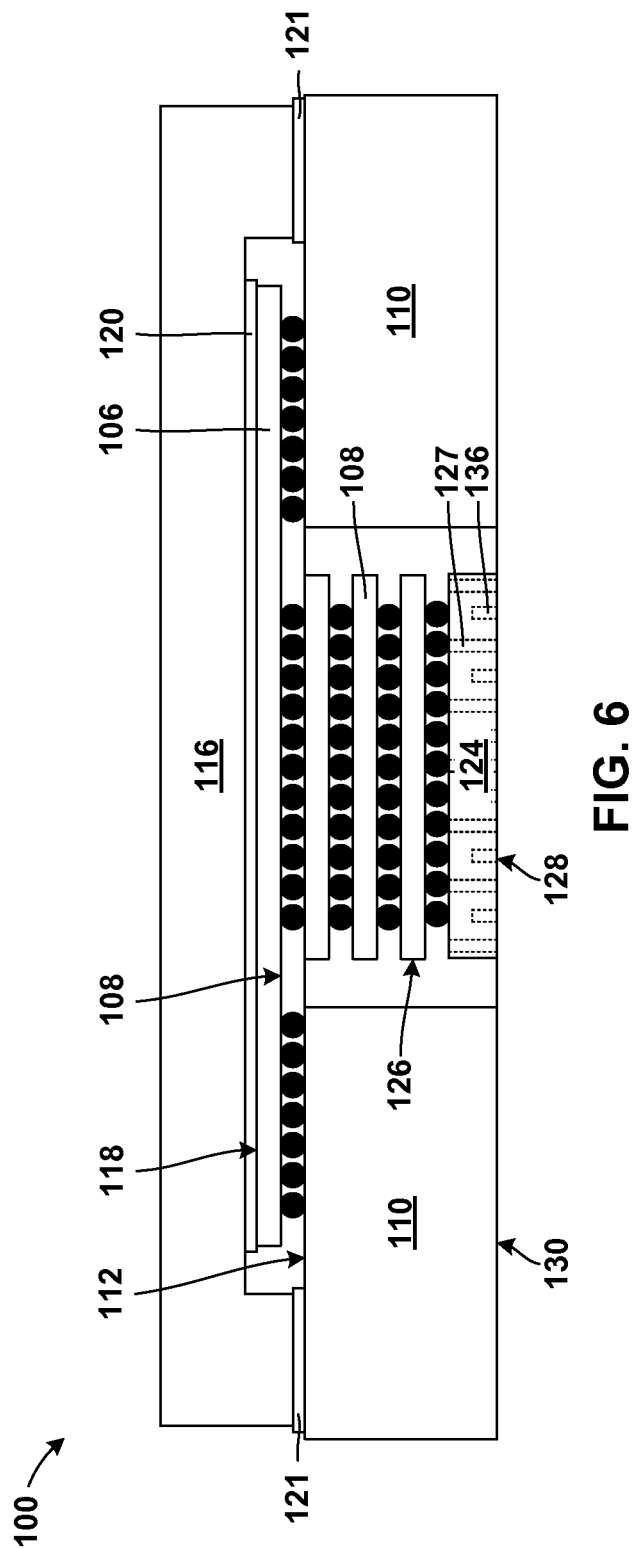
FIG. 6 illustrates attaching an interposer to the die stack according to an exemplary embodiment.

Referring now to FIG. 6, an interposer 124 may be electrically coupled to a topmost chip 126 of the die stack 102. Like above, any known solder connection, such as, for example a controlled collapse chip connection, may be used to electrically couple the interposer 124 to the topmost chip 126. Preferably, the interposer 124 may be any structure that which may facilitate an electrical connection to the topmost chip 126 of the die stack 102. Most typically, the electrical connectivity of the interposer 124 may be provided by a plurality of through-substrate vias 127. In one embodiment, the interposer 124 may include, an additional memory chip, a cap die, an organic laminate with through-substrate vias, a ceramic substrate with through-substrate vias, a silicon substrate with just through-substrate vias, or any other suitable substrate material with through-substrate vias.

In some embodiments, the interposer 124 may include one or more deep trench capacitors 136 in addition to the through-substrate vias 127. The interposer 124 may have a thickness equal to the difference between the height of the die stack 102 and the thickness of the laminate substrate 110. Stated differently, the interposer 124 may have a thickness such that a bottom 128 of the interposer 124 is substantially flush with a bottom 130 of the laminate substrate 110. Thus, the interposer 124 may be thicker when fewer chips 108 are stacked in the die stack 102. Similarly, the interposer 124 may be thinner when more chips 108 are stacked in the die stack 102.

Figure 7:
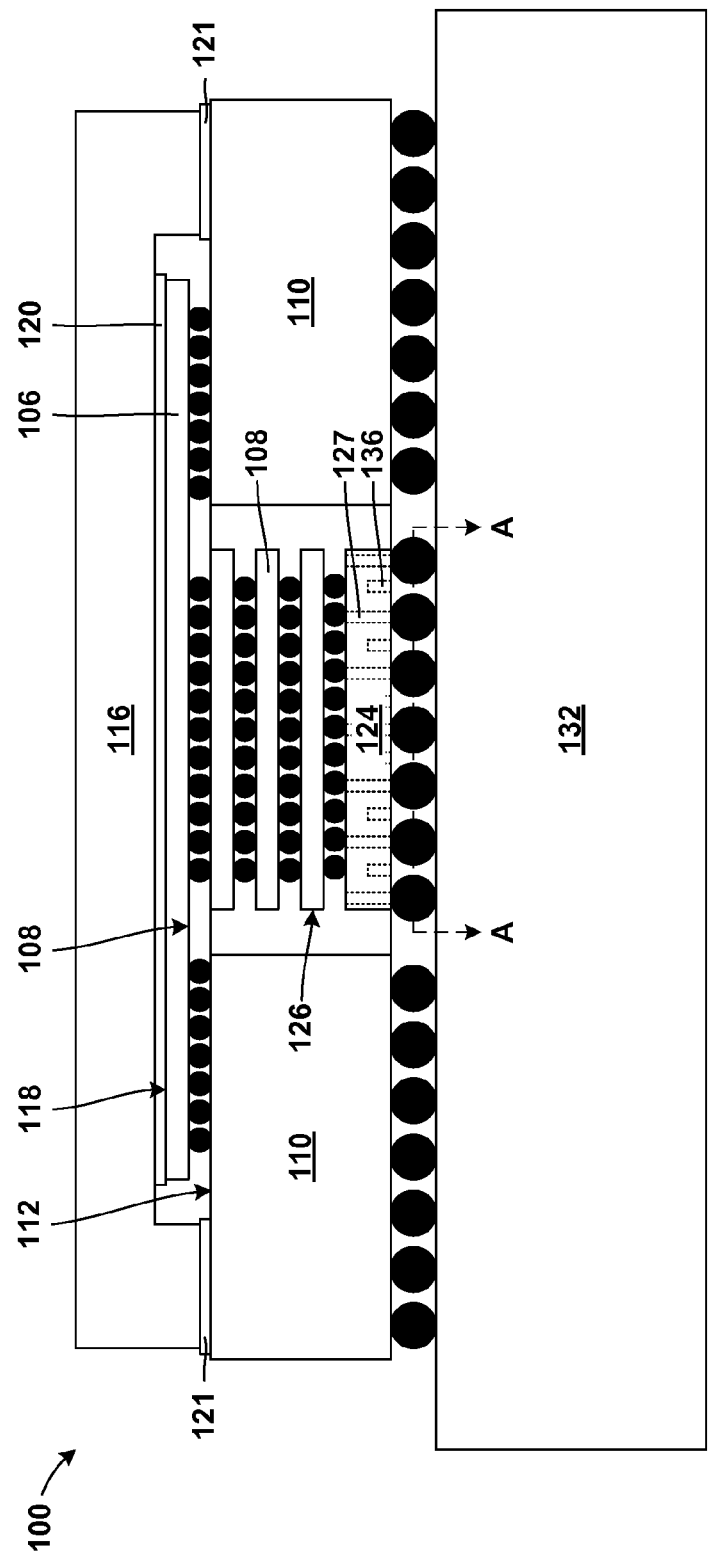
FIG. 7 illustrates attaching the laminate substrate and the interposer to a printed circuit board, and the final structure, according to an exemplary embodiment.

Referring now to FIG. 7, the laminate substrate 110 and the interposer 124, together, may be electrically coupled to a printed circuit board 132. The package 100 shown in FIG. 7 illustrates a final structure. Any known solder connection, such as, for example a surface mount solder ball join process, may be used to electrically couple the laminate substrate 110 and the interposer 124 to the printed circuit board 132. The interposer 124 effectively reduces the length of the electrical path between the printed circuit board 132 and the topmost chip 126. Power may be distributed from the printed circuit board 132 directly to the topmost chip 126 of the die stack 102.

Without the electrical connection formed by the interposer 124, the electrical path between the printed circuit board 132 and the topmost chip 126 includes multiple substrates and multiple layers of solder connections. More specifically, the electrical path between the printed circuit board 132 and the topmost chip 126 without the interposer 124 includes the laminate substrate 110, the main die 106, and multiple chips (e.g. 108) of the die stack 102 in addition to the corresponding solder connections between each. In such cases, power supplied from the printed circuit board 132 to the topmost chip 126 may experience voltage drop due to the length of the electrical path and the number of transitional connections.

Therefore, the addition of the interposer 124 according to the present embodiment allows power to be supplied from the printed circuit board 132 to the topmost chip 126 with little, if any, voltage drop. In the present embodiment, the electrical path between the printed circuit board 132 and the topmost 126 chip of the die stack 102 includes only the interposer 124 and any corresponding solder connections.

It should be noted that the direct electrical connectivity between the printed circuit board 132 and the topmost chip 126 using the interposer 124 is only possible if the opening 114 in the laminate substrate 110 extends through its entire thickness.

Figure 9:
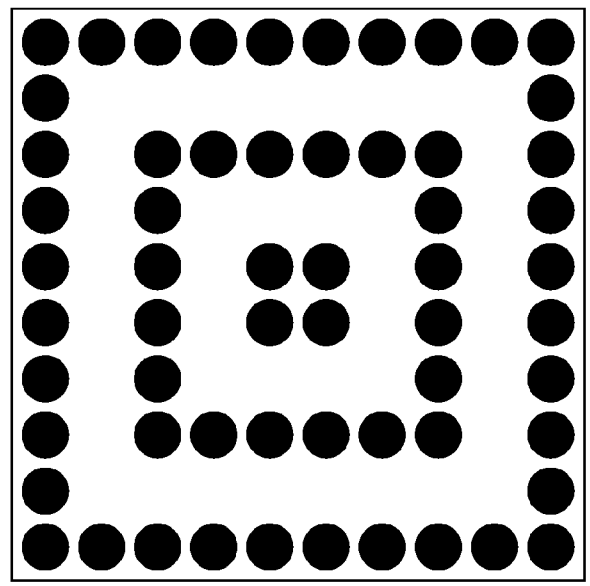
FIG. 9 is a cross section view of FIG. 7 along section line A-A according to an exemplary embodiment.
Figure 8:
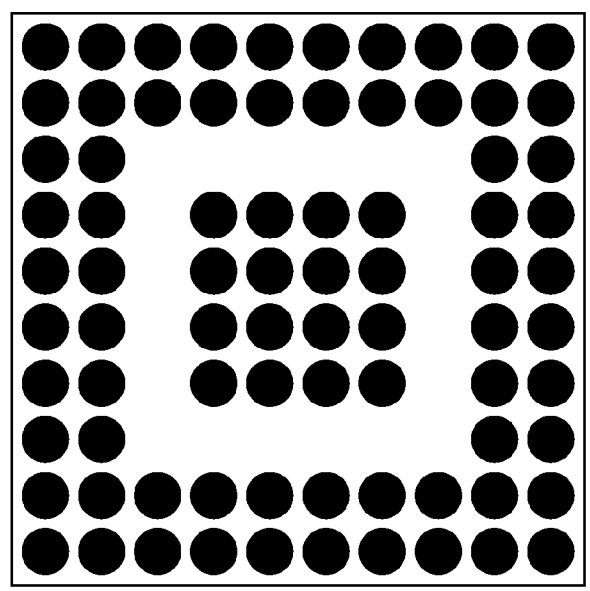
FIG. 8 is a cross section view of FIG. 7 along section line A-A according to an exemplary embodiment.

Referring now to FIGS. 8 and 9, alternative solder connection configurations between the interposer 124 and the printed circuit board 132 are shown. Both FIG. 8 and FIG. 9 are a cross section view of FIG. 7 along section line A-A. The solder connections between the interposer 124 and the printed circuit board 132 may include a power connection, a ground connection, a signal connection, or some combination thereof. In one embodiment, all of the solder connections between the interposer 124 and the printed circuit board 132 may be either power connections or ground connections. In such cases, shorts between the solder connections are irrelevant or insignificant because all of the solder connections serve the same function. In another embodiment, some fraction of the solder connections between the interposer 124 and the printed circuit board 132 may serve as a power connection, and another fraction of the solder connections between the interposer 124 and the printed circuit board 132 may serve as a ground connection. In such cases, the power connections may be separated from the ground connections by some suitable amount of space to prevent shorts.

For example, as illustrated in FIG. 8, the power connections may be located at or near the center of the connection area, and the ground connections may be located at or near the perimeter or periphery of the connection area between the interposer 124 and the printed circuit board 132, or vice versa. Alternatively, for example, as illustrated in FIG. 9, the power connections and the ground connections may be organized in more than 2 groups, provided any suitable space or distance separating power connections from adjacent ground connections. Furthermore, signal connections may be included in the embodiments illustrated in FIGS. 8 and 9.

Figure 10:
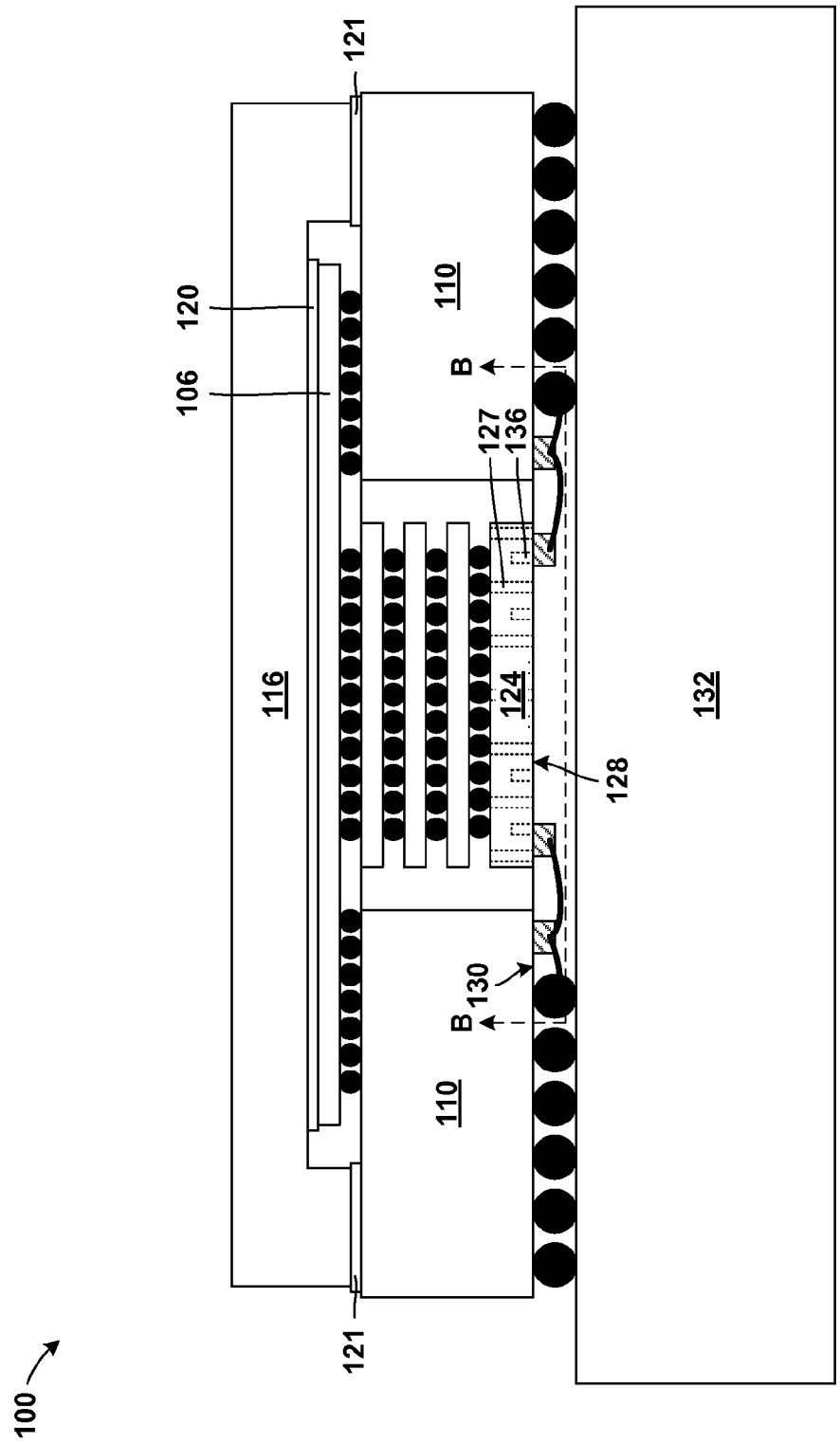
FIG. 10 illustrates the final structure according to another exemplary embodiment.
Figure 11:
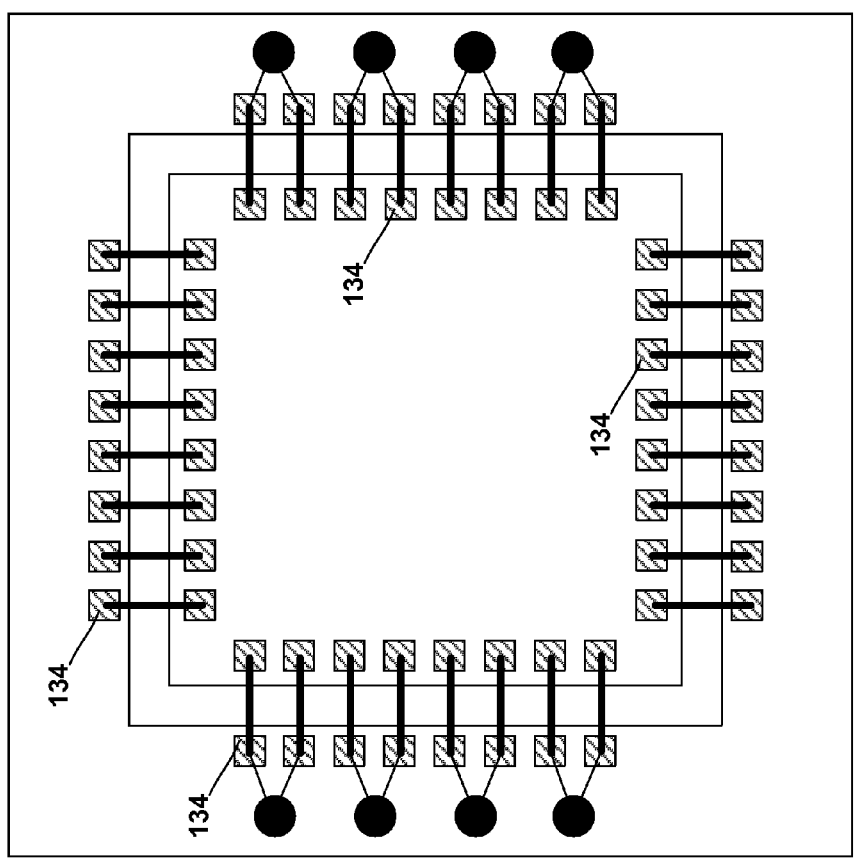
FIG. 11 is a cross section view of FIG. 10 along section line B-B according to an exemplary embodiment.

Referring now to FIGS. 10 and 11, a final package 100 is shown according to an alternative embodiment. FIG. 11 is a cross section view of FIG. 10 along section line B-B. In the present embodiment, any known wire bonding technique may be used to electrically couple the interposer 124 to the printed circuit board 132. The wire bonding technique may differ from the above embodiments, in that, a wire bond pad pattern would be included on the bottom 128 of the interposer 124, and a corresponding wire bond pad pattern would be included on the bottom 130 of the laminate substrate 110. A wire may be used according to known techniques to electrically connect the corresponding wire bond pads 134 between the interposer 124 and the laminate substrate 110. To complete the electrical connection between the interposer 124 and the printed circuit board 132 an additional wire connection is formed between the wire bond pads on the bottom of the laminate substrate 110 and an adjacent solder connection, such as, for example, an adjacent solder bump.

Therefore, an electrical connection would not be formed directly from the interposer 124 to the printed circuit board 132; however, the electrical path between the interposer 124 and the printed circuit board 132 would include one or more of the solder connections between the laminate substrate 110 and the printed circuit board 132.

It should be noted that the opening 114 in the laminate substrate 110 is still needed to form the electrical connection between the interposer 124 and the printed circuit board 132 according to the present embodiment.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
electrically coupling a die stack to a main die;
electrically coupling the main die to a laminate substrate such that the die stack extends into an opening in the laminate substrate, the opening extending through an entire thickness of the laminate substrate; and
electrically coupling an interposer to a topmost chip of the die stack, the interposer is within the opening such that a bottom surface of the interposer is substantially flush with a bottom surface of the laminate substrate.

2. The method of claim 1, further comprising;
electrically coupling a printed circuit board to the bottom of the laminate substrate and the bottom of the interposer such that the interposer forms an electrical path from the printed circuit board directly to the topmost chip of the die stack.

3. The method of claim 2, wherein electrically coupling the printed circuit board to the bottom of the laminate substrate and the bottom of the interposer comprises:
forming a surface mount solder ball connection between the printed circuit board and the laminate substrate; and
forming a wire bond connection between the interposer and the laminate substrate, the wire bond connection being formed between corresponding wire bond pads located on the bottom of the interposer and the bottom of the laminate substrate, the wire bond pads on the bottom of the laminate substrate are in electrical contact with the surface mount solder ball connection between the printed circuit board and the laminate substrate, such that an electrical path between the interposer and the printed circuit board includes the surface mount solder ball connection between the printed circuit board and the laminate substrate.

4. The method of claim 1, further comprising;
attaching a lid to a top of the laminate substrate and a bottom of the main die.

5. The method of claim 1, wherein electrically coupling the interposer to the topmost chip of the die stack comprises:
forming a controlled collapse chip connection.

6. The method of claim 1, wherein the interposer comprises one or more through-substrate vias.

7. The method of claim 1, wherein the interposer comprises one or more through-substrate vias and one or more deep trench capacitors.

8. A method comprising:
electrically coupling a die stack to a main die;
electrically coupling the main die to a laminate substrate such that the die stack extends into an opening in the laminate substrate, the opening extending through an entire thickness of the laminate substrate;
attaching a lid to a top of the laminate substrate and a bottom of the main die;
electrically coupling an interposer to a topmost chip of the die stack, the interposer is within the opening such that a bottom surface of the interposer is substantially flush with a bottom surface of the laminate substrate; and
electrically coupling a printed circuit board to the bottom of the laminate substrate and the bottom of the interposer such that the interposer forms an electrical path from the printed circuit board directly to the topmost chip of the die stack.

9. The method of claim 8, further comprising;
attaching a lid to a top of the laminate substrate and a bottom of the main die.

10. The method of claim 8, wherein electrically coupling the interposer to the topmost chip of the die stack comprises:
forming a controlled collapse chip connection.

11. The method of claim 8, wherein electrically coupling the printed circuit board to the bottom of the laminate substrate and the bottom of the interposer comprises:
forming a surface mount solder ball connection between the printed circuit board and the laminate substrate; and
forming a wire bond connection between the interposer and the laminate substrate, the wire bond connection being formed between corresponding wire bond pads located on the bottom of the interposer and the bottom of the laminate substrate, the wire bond pads on the bottom of the laminate substrate are in electrical contact with the surface mount solder ball connection between the printed circuit board and the laminate substrate, such that an electrical path between the interposer and the printed circuit board includes the surface mount solder ball connection between the printed circuit board and the laminate substrate.

12. The method of claim 8, wherein the interposer comprises one or more through-substrate vias.

13. The method of claim 8, wherein the interposer comprises one or more through-substrate vias and one or more deep trench capacitors.

* * * * *